United States Patent
Swoboda

(10) Patent No.: US 6,820,222 B2
(45) Date of Patent: Nov. 16, 2004

(54) APPARATUS AND METHOD FOR PROCESSOR POWER MEASUREMENT IN A DIGITAL SIGNAL PROCESSOR USING TRACE DATA AND SIMULATION TECHNIQUES

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 454 days.

(21) Appl. No.: 09/924,800

(22) Filed: Aug. 8, 2001

(65) Prior Publication Data

US 2003/0033564 A1 Feb. 13, 2003

(51) Int. Cl.⁷ ................................................ G06F 11/00
(52) U.S. Cl. .......................................... 714/33; 714/45
(58) Field of Search ............................. 714/33, 45, 46, 714/22; 703/22; 717/104, 151; 710/267; 713/300, 320, 321, 340

(56) References Cited

U.S. PATENT DOCUMENTS 5,557,557 A * 9/1996 Frantz et al. ................. 703/22
6,096,089 A * 8/2000 Kageshima ................... 703/18
6,125,334 A * 9/2000 Hurd ............................ 702/60
6,205,555 B1 * 3/2001 Kageshima et al. ........ 713/300
6,219,780 B1 * 4/2001 Lipasti ....................... 712/215
2002/0194511 A1 * 12/2002 Swoboda .................... 713/300
2003/0088840 A1 * 5/2003 Yonezawa et al. ............. 716/7

* cited by examiner

*Primary Examiner*—Scott Baderman
(74) *Attorney, Agent, or Firm*—William W. Holloway; W. James Brady; Frederick J. Telecky, Jr.

(57) ABSTRACT

In order to measure the power consumed by a central processing unit during execution of a software program, the trace components are used to determine the input signals and the output signals and interrupt conditions for each clock cycle. The input signals and the output signals can be applied to a simulation model of the central processing system to determine the state of the central processing unit for each clock cycle. The simulation model is also used to determine the power dissipated for each state. Combining the knowledge of the progression of states of the central processing unit with the power consumed by the central processing unit for each state, the consumption of power by the central processing unit can be determined as a function of execution of the program. By comparing the power consumed with the portion of the program being executed, the program can be adjusted to reduce the power required during the execution of the program.

18 Claims, 2 Drawing Sheets

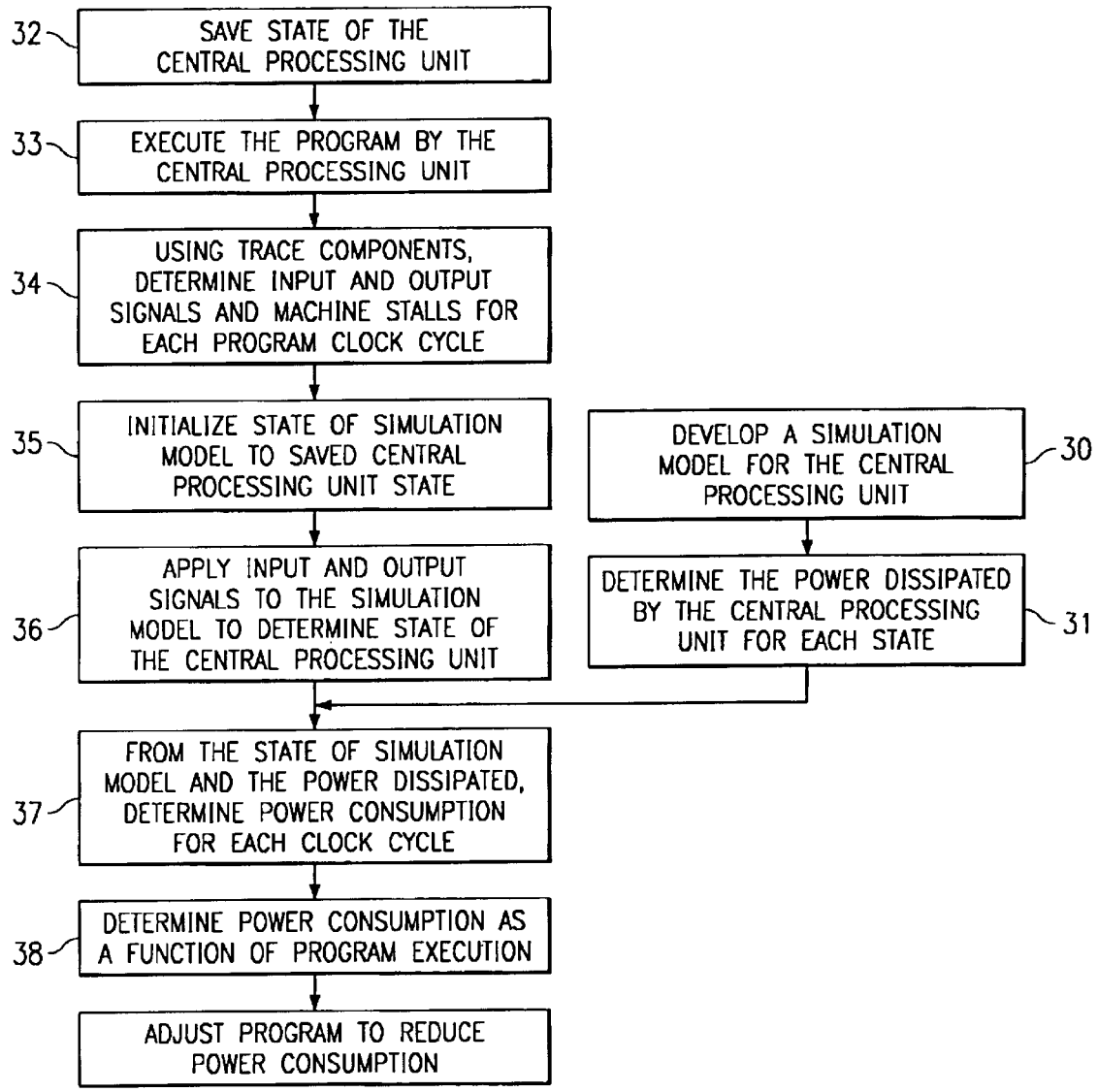

APPARATUS AND METHOD FOR PROCESSOR POWER MEASUREMENT IN A DIGITAL SIGNAL PROCESSOR USING TRACE DATA AND SIMULATION TECHNIQUES

BACKGROUND OF THE INVENTION

1. Field of the Invention

This invention relates generally to digital signal processing units and, more particularly, to techniques for determining the power consumption of digital signal processor units.

2. Background of the Invention

The digital signal processor and related devices have found increasing application in portable apparatus, such as cell phones, wireless internet devices, etc. The power consumption is a critical parameter in portable apparatus. The power consumption determines the size of the battery and the time between recharging the battery, key parameters in the portability of devices.

However, the power consumption parameter for the digital signal processor has several variables. The hardware implementing the device can, for example, be designed to run with minimum power expenditure. Even after every effort has been employed to reduce to power requirements of the hardware, the software programs may not be power efficient. Individual programs can be optimized to provide minimum power consumption. In addition, not only can the central processing unit draw power, but bus activity can also result in the consumption of power. However, before these parameters can be optimized, a technique for the measurement of the power consumption must be provided.

In designing and testing a central processing unit, a simulation model is provided for the proposed design. Using the simulation model, a simulation of the processing activity can be performed for the central processing unit, i.e., for a set of input signals and the set of output signals. Even the internal operation of the data processing unit can be determined from the simulation model. The simulation model allows design changes and improvements to be investigated in central processing unit without the lengthy process of fabricating the apparatus.

Referring to FIG. 1, a process of designing and fabricating a central processing unit is summarized. Based on a series of requirements for a central processing unit and based on characteristics of technology used in implementing a central processing unit, a simulation model is prepared in step 10. The simulation model simulates the physical electrical parameters of a physically-implemented central processing unit. Using the simulation model, the operation of the simulation model is tested and the model is refined in step 11. Any problems identified this stage are typically resolved in an updated simulation model. Because of the time required actually to fabricate a central processing unit, any problems that can be identified and resolved at this stage provides a big impact on the schedule for providing a functioning central processing unit. When a final version of the simulation model has been achieved, then a physical central processing unit is fabricated using the simulation model as template in step 12. The implemented central processing unit is tested in step 13. In step 14, the testing of the central processing unit is examined to determine if changes are necessary to the central processing unit design and, consequently, to the simulation model. When no changes are needed, the process ends in step 16. When changes in the central processing unit are required, the process proceeds to step 15 wherein the simulation model is modified. After the modifications are completed, the process returns to step 11 wherein the simulation model is tested and refined.

However, the simulation models have limitations that become apparent when the central processing unit is fabricated. In order to test and verify the operation of the implemented central processing unit, selected signals can be retrieved from the central processing unit and other selected signals applied to the central processing unit. By way of specific example, the JTAG (Joint Test Action Group) protocol identifies specific signals for application to the central processing unit and retrieval from the central processing unit. The purpose of this protocol is to standardize the signals for convenience in testing and debug processes. The signals of the JTAG protocol as well as trace signals can used in the testing and debug processes. The central processing unit typically has a trace port dedicated to exchange of the trace signals between selected components in the central processing unit and a trace unit. The trace unit is programmed to interpret the trace signals received from the central processing unit. While the JTAG protocol has been an improvement in the tools available to the designer and developer of both the central processing unit and the programs that control the operation of the central processing unit, recently, the number of trace signals has been greatly expanded, i.e., relative to the number of JTAG protocol signals. The additional signals have been particularly useful in obtaining information about the internal state of the central processing unit.

One of the most important applications of the data processing technology has be to battery-operated portable devices, for example, hand-held appliances. In these applications, the requirement is that the power consumption be as low as possible. The devices have been designed for minimum power operation. One further parameter in the reduction of power consumption is the program controlling the operation of the data processing unit. When initially developed, the program is typically not optimized for power consumption. However, several variations in a program may be possible when an attempt is made to reduce power consumption in a program.

A need has therefore been felt for apparatus and an associated method having the feature that the power consumption of a central processing unit of a digital signal processing system can be measured as the result of execution of a program. The apparatus and associated method would further have the feature that the power consumption of the program could be related to the individual steps in the program. The apparatus and associated method would still further have the feature the power consumed by the central processing unit can be determined for the individual clock cycles during the execution of the program.

SUMMARY OF THE INVENTION

The aforementioned and other features are accomplished, according to the present invention, by executing the activity for which power consumption is to be optimized in a central processing unit and using the signals collected from the central processing unit to execute the same activity on the simulation model. Trace components collect and store in memory the input signals to and the output signals from the central processing unit for each clock cycle. The signals collected are sufficient to recreate the activity of the central processing unit in a simulation model when the initial states are the same. The recorded set of input and output signals are applied to a simulation model of the central processing unit. The input signals and the output signals permit the state of the central processing unit to be determined for each clock cycle when applied to the simulation model from the equivalent initial state. Using the simulation model, the power dissipated for each state of the data processing unit can be determined. Therefore, using the input and output signals to determine the state of the central processing unit for each clock cycle, the total power used by the program can be calculated. By relating the power consumed as a function of the execution of the program, those portions of the program consuming the most power can be examined to determine whether the power being consumed can be minimized.

BRIEF DESCRIPTION OF THE DRAWINGS

FIG. 3 is flow chart describing the use of the trace signals and trace components and a simulation model to determine the power consumption by a central processing unit according to the present invention.

DESCRIPTION OF THE PREFERRED EMBODIMENT

1. Detailed Description of the Figures

Figure 1:
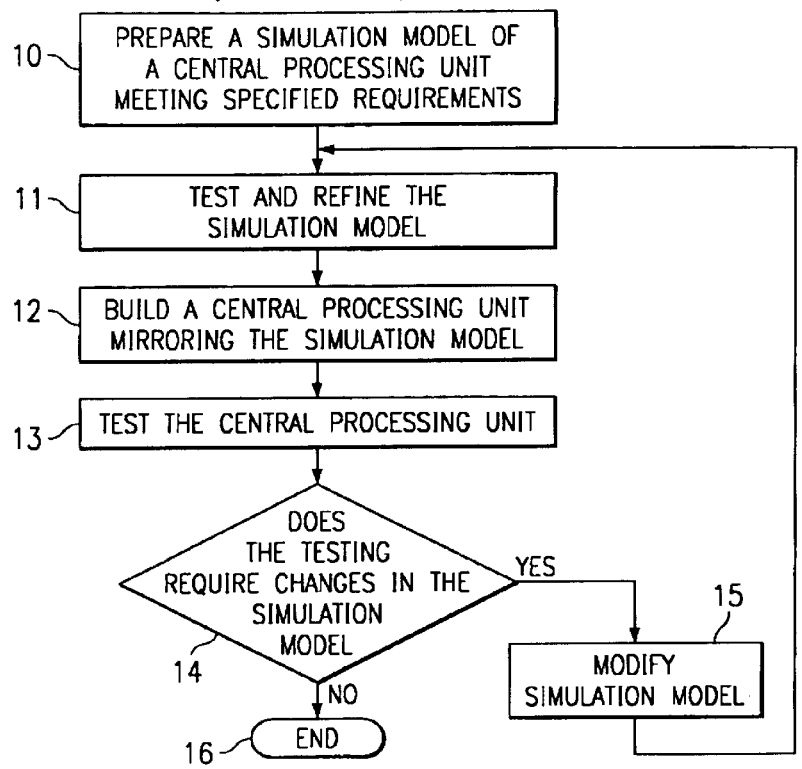
FIG. 1 is a flow chart illustrating the use of a simulation model to design and test a central processing unit according to the related art.

FIG. 1 has been described with respect to the prior related art.

Figure 2:
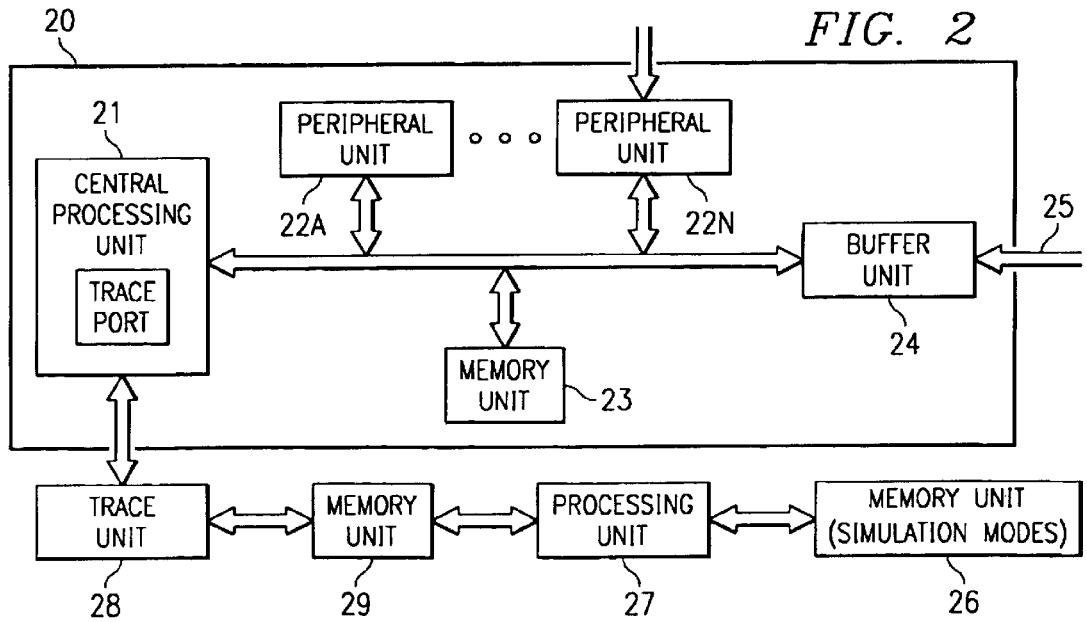
FIG. 2 is a block diagram of data processing system capable of using the present invention according to the present invention.

Referring to FIG. 2, a block diagram of data processing system capable of advantageously using the present invention is shown. The digital signal processing unit 20 includes central processing unit 21, a plurality of peripheral units 22A through 22N, a memory unit 23, and buffer unit 24. The peripheral devices 22A through 22N can have interface units that are coupled to devices external to the chip 20. An internal bus 25 couples the peripheral devices 22A through 22N, the memory unit 23 and the buffer unit 24 to the central processing unit 21. The buffer unit 24 serves as an interface unit between the internal bus 24 and an external bus 25. The central processing unit 21 furthermore includes a trace port 27. The trace port 27 provides a coupling between selected leads within the central processing unit 21 and the trace unit 28. The trace unit 28 can provide an analysis of the trace signals received from the central processing unit 21 and can determine the read data, cycle by cycle stalls, and the instruction sequence to be applied to the central processing unit 21. The trace unit 28 records traced data in the memory unit 29. The trace memory unit 29 records central processing unit-related activity. A processing unit 27 has access to the memory unit 29 storing the results of the trace acquisition and memory unit 26 storing the simulation model. The storage of the simulation model can also include the storage of parameters identifying the power dissipated for each central processing unit state transition. As will be clear, memory unit 29 and memory unit 26 can be different portion of the same memory unit. The processor 27 applies the trace acquisition results to the simulation model as will be described below.

Referring to FIG. 3, the process for minimizing the power consumption during the execution of a software program is shown. In step 30, the simulation model is developed for the central processing unit executing the program. Typically, the simulation model is generated during the design of the central processing unit. In step 31, using the simulation model, the power dissipated for each state of the central processing unit is determined. In step 32, save the initial state of the central processing unit. In step 33, the program being tested with respect to power consumption is executed on the central processing unit. Using the trace components, the input and output signals are determined for each clock cycle in step 34. In step 35, the state of the simulation model is initialized to the initial state of the central processing unit. In step 36, the input and output signals and the stall events are applied to the simulation model as described herein. The actual central processing unit generating the trace data and the simulation model (of the same central processing unit) are viewed as identical finite state machines. The input signals to the real central processing unit (read data and machine stalls) are applied to the simulation model, the simulation model being a second finite state machine. When the two state machines are started from the same state, they progress through the same sequence of states. The trace data also includes program counter information. The program counter data is used to detect the occurrence of an interrupt in the instruction processing. As a result of an interrupt process, the state progression of the simulation model and the corresponding central processing unit can differ. The program counter trace data is used to override the program counter of the simulation model thereby keeping the two finite state machines synchronized. Using the simulation model, the state of the central processing unit can be determined for all of the program execution. In step 37, the state of the central processing unit, as determined in step 36 is correlated with the power dissipation for the related state as determined in step 31. As a result of the correlation in step 37, the power consumed as a function of program portion being executed can be determined in step 38. In step 39, the program and the power dissipation for the related portions of the program can be reviewed to determine whether the program can be adjusted to reduce power.

2. Operation of the Preferred Embodiment

The present invention relies on the fact that, with the emerging test and emulation technology, detailed information can be obtained about the operation of a data processing system. The invention also relies on the procedure that the development of the data processing system requires a detailed simulation model. From the simulation model, an estimate of the power being dissipated for each state of central processing unit can be determined. When the program under investigation is executed by the central processing unit, the trace components can be used to determine all of the input signals (read data) applied to the central processing unit and the output signals be generated by the central processing unit. The applied signals and the generated signals indicating the precise point in the program at which an interrupt was taken resulting from the execution of the program are applied to the simulation model. The simulation model identifies a state defined by the applied and generated signals. As indicated above, the simulation model can be used to estimate the power consumed for each state.

Thus the power consumed for each state is known as well as the progression of the states during the execution of the program. The power consumed for the progression of states can be correlated to the executing program. Therefore, the power dissipated as a function of the program can be determined. Areas of exceptionally high power consumption of the executing program can be determined and analysis of the code can be performed to determine whether an alternative code strategy can be employed to reduce the power dissipation.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. Apparatus for measuring the power consumed by a processing unit processor bus during predetermined period of time, the apparatus comprising:

a central processing unit, the central processing unit including a trace port, the central processing unit executing a program, the central processing unit applying to a trace port trace signals resulting from the execution of the program;

a trace unit for receiving trace information from the trace port;

a first memory unit portion coupled to the trace unit for storing the trace information;

a second memory portion for storing a simulation model of the central processing unit; and a processor coupled to the first and the second memory portion; wherein the processor uses trace information applied to the simulation model to determine a state of the central processing unit for each central processing unit clock cycle, the processor determining power consumption for the program execution of the central processing unit.

2. The apparatus as recited in claim 1 wherein the processor stores parameters identifying the power dissipated for each state of the central processing unit.

3. The apparatus as recited in claim 2 wherein the parameters identifying the power dissipated for each state is determined by simulation techniques.

4. The apparatus as recited in claim 1 wherein the central processing unit and the processor are the same processing component.

5. A method for determining power consumption by a central processing unit during execution of a program, the method comprising:

executing the program by the central processing unit;

acquiring and storing the trace information for the central processing unit for each central processing unit clock cycle;

determining from a simulation model of the central processing unit a power consumption parameter for each state of the central processing unit;

using the trace information generated by the central processing unit and the simulation model to determine the state of the central processing unit as determined by the simulation model; and using the power consumption parameters, determining the power consumption for the executing program.

6. The method as recited in claim 5 wherein the power consumption is determined for each central processing unit clock cycle.

7. The method as recited in claim 5 wherein the power consumption parameters are determined by simulation techniques.

8. The method as recited in claim 5 wherein the power consumption is correlated with the execution of the program.

9. The method as recited in claim 5 wherein the using steps are performed by the central processing unit.

10. Apparatus for determining the power consumption during activity of a digital signal processing unit, the digital signal processing unit including trace export apparatus, the apparatus comprising:

a trace unit coupled to trace export apparatus in the digital signal processing unit, the trace unit receiving trace information from the digital signal processing unit, the trace unit storing the trace information of the digital signal processing unit;

a first memory unit portion for storing the trace information from the digital signal processing unit;

a second memory unit portion storing a simulation model of the digital signal processing unit; and a processor coupled to the first memory portion and the second memory portion, the processor determining the state of the of the digital signal processing unit by applying the trace information to the simulation model to identify the state progression of the digital signal processor, the state progression determining the energy consumed by digital signal processing unit.

11. The apparatus as recited in claim 10 wherein the second memory portion stores power consumed for each digital signal processing unit state for each clock cycle.

12. The apparatus as recited in claim 11 wherein the power consumed for each digital signal processing unit state is determined by simulation techniques.

13. The apparatus as recited in claim 10 wherein the trace information is determined for each clock cycle.

14. The apparatus as recited in claim 13 wherein the power consumed by the digital signal processing unit is correlated to the activity of the digital signal processing unit.

15. The apparatus as recited in claim 10 wherein the digital signal processing unit is a central processing unit.

16. The apparatus as recited in claim 10 wherein the digital signal processing unit and the processor are the same component.

17. A data processing system for determining the power consumed in response to an activity of a central processing unit, the data processing system comprising:

a central processing unit, the central processing unit including trace export apparatus;

a first storage unit portion coupled to the central processing unit;

a trace unit coupled to the trace export apparatus and the first storage portion, the trace unit storing trace information generated in response to the activity on the central processing unit; and a second storage unit portion, the second storage unit portion having a simulation model of the central processing unit stored therein, the second storage portion storing values of the energy consumption for each state;

wherein the central processing unit applies the trace information to the simulation model to determine the state progression of central processing unit states during the activity, the central processing unit using the energy consumption value for each state of the state progression to determine the total power consumed by the central processing unit during the activity.

18. The data processing system as recited in claim 17 wherein the power consumption values are determined by simulation techniques.

* * * * *